United States Patent
Nagayama et al.

(10) Patent No.: US 10,565,926 B2
(45) Date of Patent: Feb. 18, 2020

(54) OLED PIXEL CIRCUIT AND DRIVING METHOD AND RELATED DISPLAY PANEL AND DISPLAY APPARATUS

(71) Applicant: BOE TECHNOLOGY GROUP CO., LTD., Beijing (CN)

(72) Inventors: Kazuyoshi Nagayama, Beijing (CN); Song Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 310 days.

(21) Appl. No.: 15/757,845

(22) PCT Filed: Aug. 14, 2015

(86) PCT No.: PCT/CN2015/087021
§ 371 (c)(1),
(2) Date: Mar. 6, 2018

(87) PCT Pub. No.: WO2016/101634
PCT Pub. Date: Jun. 30, 2016

(65) Prior Publication Data
US 2018/0233083 A1    Aug. 16, 2018

(30) Foreign Application Priority Data
Dec. 24, 2014    (CN) .......................... 2014 1 0817253

(51) Int. Cl.
*G09G 3/3233*    (2016.01)
*G09G 3/3283*    (2016.01)
*H01L 27/32*    (2006.01)

(52) U.S. Cl.
CPC ......... *G09G 3/3233* (2013.01); *G09G 3/3283* (2013.01); *H01L 27/3265* (2013.01);
(Continued)

(58) Field of Classification Search
CPC .................................................... G09G 3/3233
(Continued)

(56) References Cited

U.S. PATENT DOCUMENTS

2003/0067424 A1    4/2003    Akimoto et al.
2008/0170011 A1    7/2008    Kohno et al.
(Continued)

FOREIGN PATENT DOCUMENTS

CN    101221726 A    7/2008
CN    101241674 A    8/2008
(Continued)

OTHER PUBLICATIONS

International Search Report dated Aug. 14, 2015, issued in counterpart International Application No. PCT/CN2015/087021 (14 pages).

*Primary Examiner* — Long D Pham
(74) *Attorney, Agent, or Firm* — Westerman, Hattori, Daniels & Adrian, LLP (57) ABSTRACT

An OLED pixel circuit includes a charging control module (1), a resetting control module (2), and a driving transistor (3). The charging control module (1) is connected to a data signal line and the resetting control module (2). The resetting control module (2) is connected to the driving transistor (3) to reset and compensate the driving transistor (3) to set a control terminal of the driving transistor (3) at a first potential value. The driving transistor (3) is configured to generate a driving current being based on a difference between a potential of a source of the driving transistor and the first potential value, irrespective of a voltage signal at the source of the driving transistor and a threshold voltage of the driving transistor (3).

15 Claims, 8 Drawing Sheets

(52) U.S. Cl.
CPC ............ *G09G 2300/0819* (2013.01); *G09G 2300/0842* (2013.01); *G09G 2300/0852* (2013.01); *G09G 2300/0861* (2013.01)

(58) Field of Classification Search
USPC .......................................... 345/82
See application file for complete search history.

(56) References Cited

U.S. PATENT DOCUMENTS

| | | | |
|---|---|---|---|
| 2011/0050740 A1* | 3/2011 | Lee ................ | G09G 3/3233 345/690 |
| 2011/0096059 A1* | 4/2011 | Ohhashi ............ | G09G 3/3233 345/212 |
| 2014/0022150 A1 | 1/2014 | Guo et al. | |
| 2014/0192037 A1* | 7/2014 | Chung ............... | G09G 3/2022 345/212 |

FOREIGN PATENT DOCUMENTS

| | | |
|---|---|---|
| CN | 102682704 A | 9/2012 |
| CN | 102930824 A | 2/2013 |
| CN | 104409050 A | 3/2015 |

* cited by examiner

OLED PIXEL CIRCUIT AND DRIVING METHOD AND RELATED DISPLAY PANEL AND DISPLAY APPARATUS

CROSS-REFERENCES TO RELATED APPLICATIONS

This PCT patent application claims priority of Chinese Patent Application No. 201410817253.8, filed on Dec. 24, 2014, the entire content of which is incorporated by reference herein.

FIELD OF THE INVENTION

The present invention generally relates to the display technologies and, more particularly, relates to an OLED pixel circuit and driving method, a display panel, and a display apparatus containing the same.

BACKGROUND

AMOLED (Active Matrix Organic Light Emitting Diode) display panels utilize OLEDs (Organic Light Emitting Diodes) to illuminate light with varying brightness levels so that pixels corresponding to the OLEDs can display brightness levels in accordance with the OLEDs. Compared to a conventional TFT LCD (Thin-Film Transistor Liquid Crystal Display), an AMOLED display panel may have a faster response time, higher display contrasts, and a wider viewing angle. Technologies related to AMOLED display panels have developed significantly in the past few years.

On aspect of the development of AMOLED display technologies is to improve the brightness level and quality of display of the display panels.

BRIEF SUMMARY OF THE DISCLOSURE

The present invention addresses the above problems in the prior art. The present disclosure provides an OLED pixel circuit and method for driving the circuit, a display panel, and a display apparatus. The OLED pixel circuit can avoid/reduce the IR drop of the voltage signal and avoid or lessen the negative effects on the quality of display caused by the variations of the threshold voltage.

One aspect of the present disclosure provides an OLED pixel circuit. The OLED pixel circuit includes a charging control module, a resetting control module, and a driving transistor. The charging control module is connected to a data signal line and the resetting control module; the resetting control module is connected to the driving transistor to reset and compensate the driving transistor to set a control terminal of the driving transistor at a first potential value; and the driving transistor is configured to generate a driving current being based on a difference between a potential of a source of the driving transistor and the first potential value, irrespective of a voltage signal at the source of the driving transistor and a threshold voltage of the driving transistor.

Optionally, the charging control module is configured to receive a data signal from the data signal line and to provide the data signal to the resetting control module.

Optionally, the OLED pixel circuit further includes an illuminating control module and an illuminating device, wherein the illuminating control module is between the driving transistor and the illuminating device to control a connection between the driving transistor and the illuminating device.

Optionally, under the control of a threshold voltage signal, a voltage signal provided by the voltage signal terminal flows from the driving transistor into the resetting control module, resetting and compensating the driving transistor to set a control terminal of the driving transistor at a first preset potential.

Optionally, the resetting control module further includes a first transistor, wherein a control terminal of the first transistor is connected to a threshold voltage signal terminal; a first terminal of the first transistor is connected to a drain of the driving transistor and an input terminal of the illuminating control module; and a second terminal of the first transistor is connected to the control terminal of the driving transistor; and a first capacitor placed between an output terminal of the charging control module and the control terminal of the driving transistor.

Optionally, the resetting control module further includes a second capacitor; a first terminal of the second capacitor is connected to a terminal of the first capacitor and a control terminal of the driving transistor, and a second terminal of the second capacitor is connected to the voltage signal terminal.

Optionally, under the control of a gate signal provided by a gate line, the charging control module provides a data signal to the resetting control module.

Optionally, the charging control module includes a second transistor, wherein: a control terminal of the second transistor is connected to the gate line for providing scanning signals; a first terminal of the second transistor is connected to the data line; and a second terminal of the second transistor is connected to a first terminal of the first capacitor.

Optionally, the control terminal of the driving transistor is connected to a terminal of the first capacitor and a second terminal of the first transistor; the source of the driving transistor is connected to a voltage signal terminal; and the drain of the driving transistor is connected to the first terminal of the first transistor and the input terminal of the illuminating control module.

Optionally, under the control of an illuminating signal provided by an illuminating signal terminal, the driving current flows from the driving transistor into the illuminating device.

Optionally, the illuminating control module includes a third transistor, wherein: a control terminal of the third transistor is connected to the illuminating signal terminal; a first terminal of the third transistor is connected to the drain of the driving transistor; and a second terminal of the third transistor is connected to an input terminal of the illuminating device.

Optionally, the first transistor, the second transistor, the third transistor, and the driving transistor are P-type transistors.

Another aspect of the present disclosure provides a method for driving the disclosed OLED pixel circuit, the method includes: in a first phase, sending, by the data line, a first data signal to the resetting control module to reset and compensate the driving transistor; in a second phase, sending a second data signal by the data line to the resetting control module to set the control terminal of the driving transistor at a first preset potential, and generating the driving current by the driving transistor based on the potential difference to drive the illuminating device to emit light; and in a third phase, sending, by the illuminating signal terminal, a signal to the illuminating control module to provide electrical connection between the driving transistor and the illuminating device.

Optionally, in a phase t1 of the first phase, charging, by the charging control module, the first terminal of the first capacitor such that the first terminal receives a first data signal, the driving transistor is turned on; and in a phase t2 of the first phase, inputting, an "on" signal, by the threshold voltage signal terminal, to the control terminal of the first transistor to turn on the first transistor, wherein the first terminal of the first capacitor is connected to the charging control module and the second terminal of the first capacitor is connected to the driving transistor.

Optionally, in the phase t1, the first transistor is turned on such that the voltage signal terminal is electrically connected to the driving transistor to reset potentials of the control terminal and the second terminal of the driving transistor.

Optionally, in the phase t2, the first transistor is turned on such that the voltage signal terminal is electrically connected to the driving transistor to input a high potential to compensate the control terminal and the second terminal of the driving transistor.

Optionally, in the second phase, the second transistor is turned on such that the data line is connected to the first terminal of the first capacitor and the control terminal of the driving transistor is at the first preset potential.

Optionally, in the third phase, the illuminating control terminal inputs an "on" signal to the control terminal of the third transistor to turn on the third transistor such that the driving transistor is electrically connected to the illuminating device.

Optionally, the second transistor is turned off in the first phase and the second phase.

Another aspect of the present disclosure provides a display panel, incorporating an disclosed OLED pixel circuit.

Another aspect of the present disclosure provides a display apparatus, incorporating a disclosed display panel.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

A driving current for driving the OLED to emit light can be represented as $I_{OLED}=\beta/2\ (V_{gs}-V_{th})^2$, wherein $V_{gs}$ represents the potential difference between the gate and the source of the driving transistor, $\beta$ represents a constant associated with the process parameters and feature size of the driving transistor, and $V_{th}$ represents the threshold voltage of the driving transistor.

Based on the formula described above, the driving current for driving the OLED to emit light is associated with the threshold voltage, i.e., $V_{th}$, of the driving transistor. In practice, the threshold voltage $V_{th}$ of the driving transistor may vary when the OLED emits light, and the voltage signal transmitted into the driving transistor may also undergo an IR drop (voltage drop). As a result, the brightness level of the OLED illumination can be affected, and the quality of display of the AMOLED display panel can be adversely affected.

One aspect of the present disclosure provides an OLED pixel circuit and a method for driving the circuit.

Figure 1:
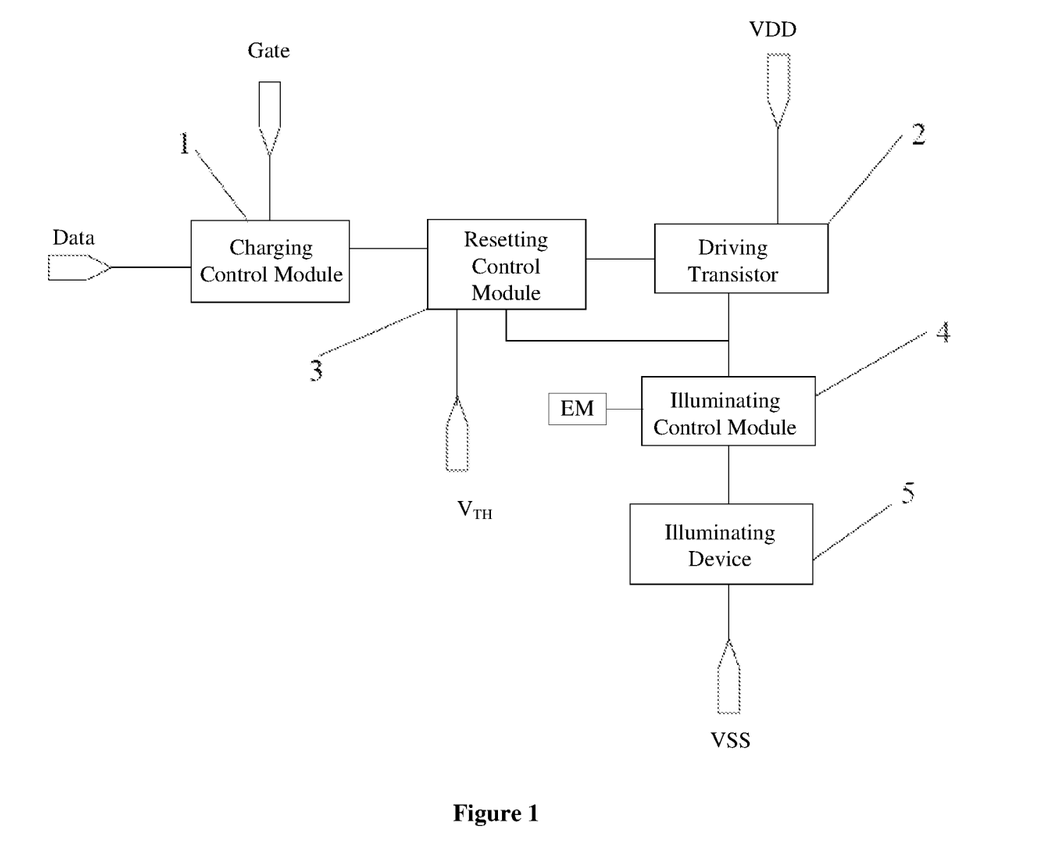
FIG. 1 illustrates an exemplary OLED pixel circuit provided by the present disclosure according to the embodiments.

As shown in FIG. 1, the present disclosure provides an OLED pixel circuit. In one embodiment, the OLED pixel circuit may include a charging control module 1, a driving transistor 2, a resetting control module 3, an illuminating control module 4, and an illuminating device 5 (e.g., an OLED). The charging module 1 can be connected to a data line (Data) and the resetting control module 3, where the data line (Data) may provide data signals to the OLED pixel circuit. The charging control module 1 may allow data signals sent by the data line (Data) to reach the resetting control module 3. The resetting control module 3 may be connected to the driving transistor 2 to reset and compensate the driving transistor 2 based on the data signals received such that the control terminal of the driving transistor 2 has a first preset potential. The driving transistor 2 may generate a driving current to drive the illuminating device to emit light, wherein the driving current is generated based on a potential difference between the potential of the source of the driving transistor 2 and the potential of the control terminal (i.e., the first preset potential) of the driving transistor 2. The illuminating control module 4 may be arranged between the driving transistor 2 and the illuminating device 5 to provide electrical connection between the driving transistor 2 and the illuminating device 5. The illuminating control module 4 may control the illuminating device 5 to be connected or disconnected from the driving transistor 2.

Specifically, in one embodiment, the control terminal of each of the transistors described below is the gate of the transistor. The first terminal of a transistor can be the source of the transistor and the second terminal can be the drain of the transistor. It is also understandable that the first terminal can be the drain and the second terminal can be the source.

Specifically, the control terminal of the charging control module 1 may be connected to a gate line (Gate), the input terminal of the charging control module 1 may be connected to the data line (Data), and the output terminal of the charging control module 1 may be connected to the first input terminal of the resetting control module 3. The source of the driving transistor 2 may be connected to the voltage signal terminal VDD. The control terminal of the resetting control module 3 may be connected to the threshold voltage signal terminal $V_{TH}$, and the output terminal of the resetting control module 3 may be connected to the control terminal of the driving transistor 2. The second input terminal of the resetting control module 3 may be connected to the drain of the driving transistor 2 and the input terminal of the illuminating control module 4. The control terminal of the illuminating control module 4 may be connected to the illumination signal terminal (EM), and the output terminal of the illuminating control module 4 may be connected to the input terminal of the illuminating device 5. The output terminal of the illuminating device 5 may be connected to the low potential signal terminal VSS.

Under the control of a gate signal provided by the gate line, the charging control module 1 may provide/transmit a data signal provided by the data line to the resetting control module. Under the control of a threshold voltage signal provided by the threshold voltage signal terminal $V_{TH}$, a voltage signal provided by the voltage signal terminal VDD may flow from the driving transistor into the resetting control module 3 for resetting and compensating the driving transistor to set a control terminal of the driving transistor to be a first preset potential. The driving transistor may be configured to generate a driving current to drive the illuminating device to emit light. The driving current may be based on a potential difference between a potential of a source of the driving transistor and the first preset potential, and may be free of the voltage signal provided by VDD and the threshold voltage of the driving transistor $V_{th}$. Under the control of an illuminating signal provided by the illuminating signal terminal EM, the driving current may flow from the driving transistor into the illuminating device 5 such that the illuminating device 5 may emit light.

The first phase may include a resetting phase and a compensating phase. In the first phase, according to the control signal from the gate line (Gate), the charging control module 1 may provide electrical connection between the first input terminal of the resetting control module 3 and the data line (Data). The data line (Data) may input a first data signal VDATA into the resetting control module 3. The resetting control module 3 may reset the potentials of the control terminal and drain of the driving transistor 2, and compensate the potentials of the control terminal and drain of the driving transistor 2 with reference potentials according to the control signals from the threshold voltage signal terminal $V_{TH}$ and the voltage signal terminal VDD. In one embodiment, a resetting phase is a phase before a GOA or Gate driver is in operation. In other words, in the first phase, the potential at N1 in FIG. 2 of each pixel may be reset before a GOA or Gate driver is in operation.

The second phase may be referred as a data writing phase, e.g., a data load phase. In the second phase, the charging control module 1 may write Vref, the second data signal inputted by the data line (Data), into the resetting control module 3 according to the control signal of the gate line (Gate). The control terminal of the driving transistor 2 may have the first preset potential. In addition, based on the difference between the potential of the source of the driving transistor 2 and the first preset potential, the driving transistor 2 may generate a driving current to drive the illuminating device to emit light.

The third phase may be referred as an illuminating phase. In the third phase, the illuminating control module 4 may provide electrical connection between the drain of the driving transistor 2 and the input terminal of the illuminating device 5 according to the control signal of the illumination signal terminal (EM). The driving current may flow from the driving transistor 2 into the illuminating device 5 to drive the illuminating device 5 to emit light.

In one embodiment, in the resetting and compensating phases, i.e., the first phase, the charging control module 1 may provide the electrical connection between the first input terminal of the resetting control module 3 and the data line (Data) according to the control signal of the gate line (Gate). The charging control module 1 may input the first data signal VDATA, inputted by the data line (Data), to the first terminal of the resetting control module 3. The resetting control module 3 may reset the control terminal and the drain of the driving transistor 2, and compensate potentials of the control terminal and the drain of the driving transistor 2 with reference potentials according to the control signals of the threshold voltage signal terminal $V_{TH}$ and the voltage signal terminal VDD. That is, in the resetting phase, the voltage signal terminal VDD may input a low potential Vlow into the driving transistor 2, and the resetting control module 3 may reset potentials of the control terminal and the drain of the driving transistor 2. In the compensating phase, the voltage signal terminal may input a high potential ELVDD into the driving transistor 2, and the resetting control module 3 may charge the control terminal and the drain of the driving transistor 2 to compensate the potentials of the control terminal and the drain with reference potentials.

Further, In the data writing phase, the charging control module 1 may write the second data signal Vref, inputted by the data line (Data), into the resetting control module 3 according to the control signal of the gate line (Gate). The resetting control module 3 may write the second data signal Vref into the control terminal of the driving transistor 2. In the illuminating phase, the illuminating control module 4 may provide the electrical connection between the drain of the driving transistor 2 and the input terminal of the illuminating device 5 according to the control signal of the illuminating signal terminal (EM). The data signal written into the driving transistor 2 and the reference potentials compensated into the driving transistor 2 may be integrated by the illuminating control module 4 to eliminate the voltage signal VDD and the threshold voltage $V_{th}$. Then, the illuminating control module 4 may generate current to drive the illuminating device 5 to emit light. Thus, the embodiment described above may provide the driving current to be independent of the voltage signal VDD and the threshold voltage $V_{th}$. The negative effect on the display brightness level of the illuminating device 5, which may be caused by the attenuation of voltage signal VDD and the variation of the threshold voltage $V_{th}$ of the driving transistor, can be eliminated. The quality of display may thus be improved.

Figure 2:
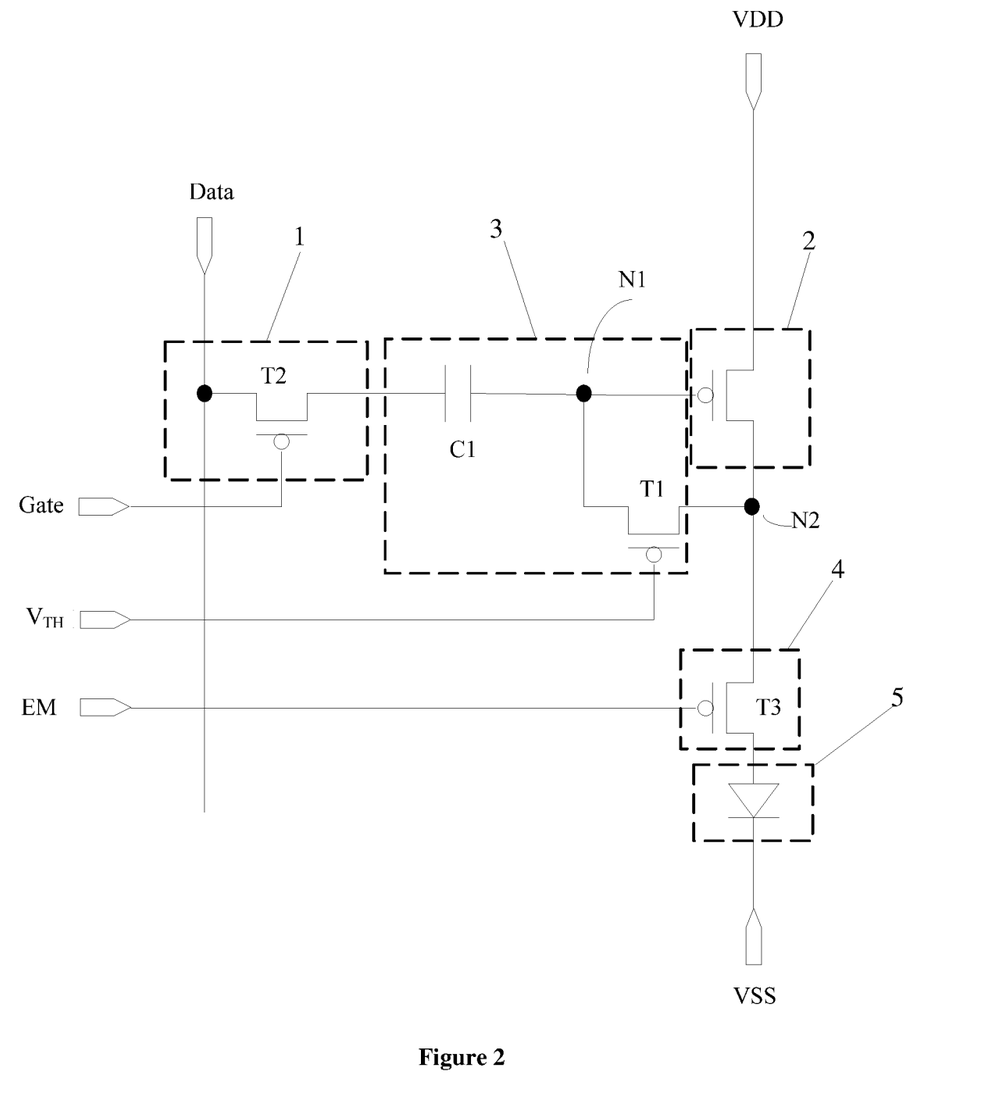
FIG. 2 illustrates an exemplary circuit diagram of the OLED pixel circuit of FIG. 1 according to the disclosed embodiments.

In practice, as shown in FIG. 2, the resetting control module 3 may include a first capacitor and a first transistor T1. The control terminal of the first transistor T1 may be connected to the threshold voltage signal terminal $V_{TH}$, and the first terminal of the first transistor T1 may be connected to the drain of the driving transistor 2 and the input terminal of the illuminating control module 4. The second terminal of the first transistor T1 may be connected to the control terminal of the driving transistor 2. The first capacitor C1 may be arranged between the output terminal of the charging control module 1 and the control terminal of the driving transistor 2 to connect the output terminal of the charging control module 1 to the control terminal of the driving transistor 2.

In the resetting phase, the first transistor T1 may be turned on according to the control signal of the threshold voltage signal terminal $V_{TH}$. The first transistor T1, in the "on" state, may provide the electrical connection between the control terminal of the driving transistor 2 and the voltage signal terminal VDD. The voltage signal terminal VDD may input a low potential Vlow to reset the potentials of the control terminal and the second terminal (i.e., drain) of the driving transistor 2.

In the compensating phase, the voltage signal terminal VDD may input a high potential ELVDD. Since the first transistor T1 is still on, the first transistor T1 may provide the electrical connection between the control terminal and the drain of the driving transistor 2 to compensate the control terminal (N1) and the drain (N2) of the driving transistor 2 with reference potentials. Specifically, as shown in FIG. 2, the first transistor T1 may be a P-type transistor. When the threshold voltage signal terminal $V_{TH}$ outputs a low potential, the first transistor T1, in the "on" state, may provide electrical connection between the control terminal and the drain of the driving transistor 2. For a P-type transistor, the threshold voltage $V_{th}$ is negative.

In practice, as shown in FIG. 2, the charging control module 1 may include a second transistor T2. The control terminal of the second transistor T2 may be connected to the gate line (Gate), where the gate line (Gate) may provide scanning signals to the OLED pixel circuit. The first terminal of the second transistor T2 may be connected to the data line (Data), and the second terminal of the second transistor T2 may be connected to a first terminal of the first capacitor C1. In the resetting and compensating phase, the second transistor T2 may be turned on according to the control signal of the gate line (Gate). The second transistor T2, in the "on" state, may provide electrical connection between the data line (Data) and the first terminal of the first capacitor C1 such that the second transistor T2 may write the first data signal VDATA, inputted by the data line (Data), into the first terminal of the first capacitor C1. In the data writing phase, the second transistor T2 may be on, and the second transistor T2 may write the second data signal Vref, inputted by the data line (Data), into the first terminal of the first capacitor C1. Specifically, as shown in FIG. 2, the second transistor T2 may be a P-type transistor. When the gate line (Gate) inputs a low potential signal, the second transistor T2 may be on, and the second transistor T2, in the "on" state, may provide the electrical connection between the data line (Data) and the first terminal of the first capacitor C1.

In one embodiment, as shown in FIG. 2, the control terminal of the driving transistor 2 may be connected to both the second terminal of the first capacitor C1 and the second terminal of the first transistor T1. The source of the driving transistor 2 may be connected to the voltage signal terminal VDD. The drain of the driving transistor 2 may be connected to both the first terminal of the first transistor T1 and the input terminal of the illuminating control module 4. Specifically, the driving transistor 2 may be a P-type transistor. In the resetting phase, the voltage signal terminal may input a low potential signal Vlow to reset the gate (i.e., the control terminal) of the driving transistor 2. The resetting process can ensure the driving transistor 2 is on in the compensating phase such that the reference potentials can be compensated.

In practice, as shown in FIG. 2, the illuminating control module 4 may include a third transistor T3. The control terminal of the third transistor T3 may be connected to the illuminating signal terminal (EM). The first terminal of the third transistor T3 may be connected to the drain of the driving transistor 2, and the second terminal of the third transistor T3 may be connected to the input terminal of the illuminating device 5. In the illuminating phase, the third transistor T3 may provide the electrical connection between the drain of the driving transistor 2 and the input terminal of the illuminating device 5 according to the control signal of the illuminating signal terminal (EM) such that the driving transistor 2 may drive the illuminating device 5 to emit light normally. Specifically, as shown in FIG. 2, the third transistor may be a P-type transistor. When the illuminating signal terminal (EM) inputs a low potential signal, the third transistor T3 may be turned on. The third transistor T3, in the "on" state, may provide the electrical connection between the drain of the driving transistor 2 and the input terminal of the illuminating device 5.

It should be noted that, the driving transistor 2 and other transistors described in the embodiments may be TFTs (Thin-Film Transistors), and/or MOS (Metal Oxide Semiconductor) transistors. The types of the transistors are not limited to the embodiments of the present disclosure.

Figure 3:
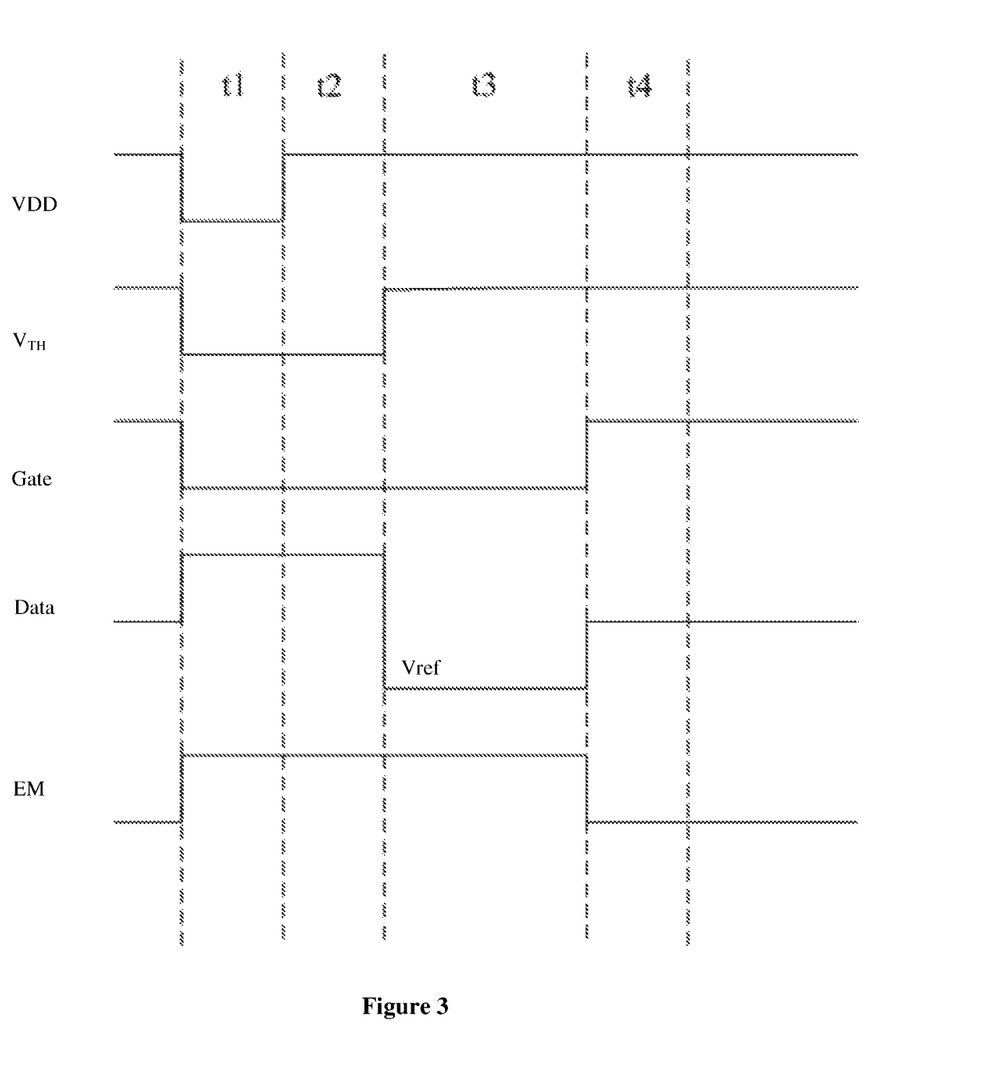
FIG. 3 illustrates an exemplary timing chart of the signals in the circuit diagram of FIG. 2 according to the disclosed embodiments.

The operation process of the OLED pixel circuit provided in the present disclosure is described in detail in light of the operation timing of the OLED pixel circuit in the embodiments. For example, the operation process of the OLED pixel circuit may be described in light of the OLED pixel circuit of FIG. 2 and the timing chart of different signals of FIG. 3. Specifically, certain input and output signals in four phases in FIG. 3, t1 to t4, can be selected to illustrate the operation process of the OLED pixel circuit. The first phase described above may be divided into phase t1 (resetting phase) and phase t2 (compensating phase), the second phase described above may correspond to phase t3 (data writing phase), and the third phase described above may correspond to phase t4 (illuminating phase).

Figure 4:
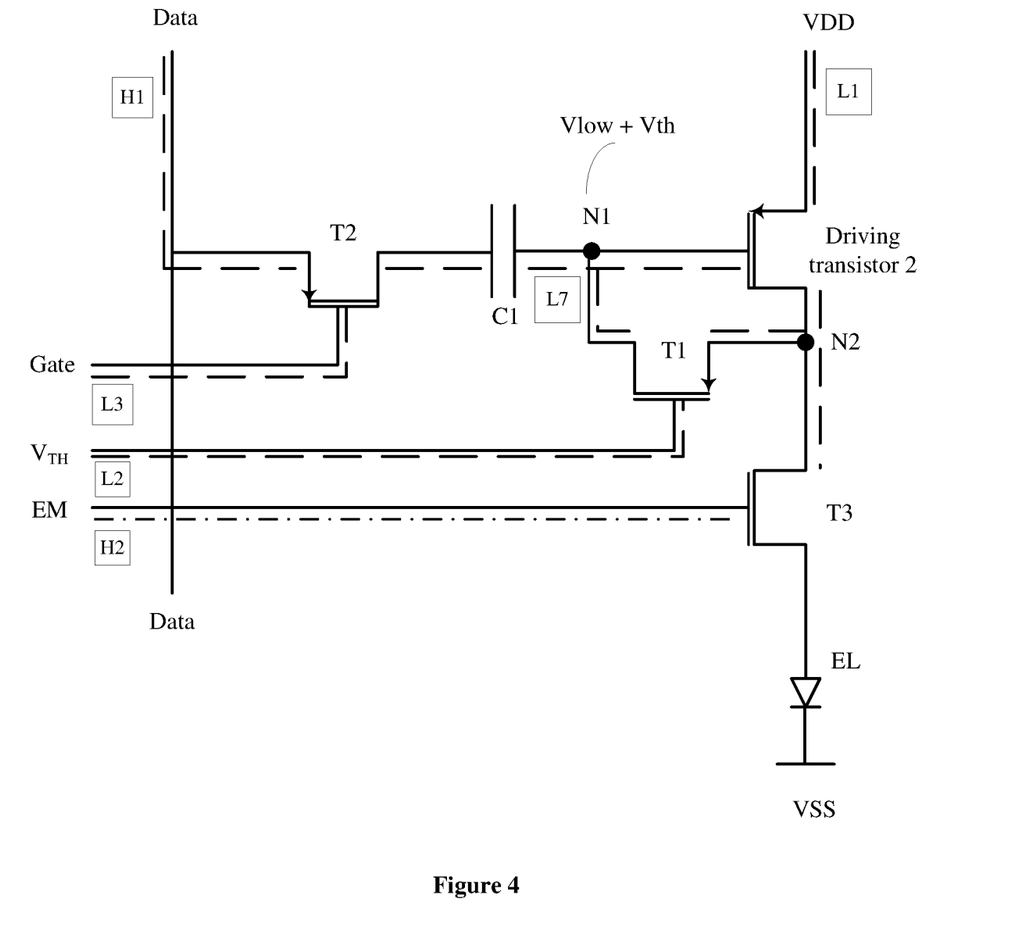
FIGS. 4-7 illustrate certain circuit diagrams of the OLED pixel circuit of FIG. 1 according to the disclosed embodiments.

In phase t1, the voltage signal terminal VDD may output a low potential signal Vlow (represented as a dashed line and marked as L1 in FIG. 4), the threshold voltage signal terminal $V_{TH}$ may output a low potential signal (represented as a dashed line and marked as L2 in FIG. 4), and the gate line (Gate) may output a low potential signal (represented as a dashed line and marked as L3 in FIG. 4). The data line (Data) may output the first data signal VDATA (represented as a dashed line and marked as H4 in FIG. 4), and the illuminating control terminal (EM) may output a high potential signal (represented as a dash-dotted line and marked as H5 in FIG. 4). The first transistor T1 and the second transistor T2 may be turned on, and the third transistor T3 may be turned off. The first transistor T1, in the "on" state, may provide the electrical connection between the control terminal N1 and the drain N2 of the driving transistor 2. The second transistor T2, in the "on" state, may provide the electrical connection between the data line (Data) and the first terminal of the first capacitor C1. The voltage signal terminal VDD may send the low potential signal Vlow to the driving transistor 2. Thus, the potentials of the control terminal N1 and the drain N2 of the driving transistor 2 may both be (Vlow+$V_{th}$). $V_{th}$ represents the threshold voltage of the driving transistor 2. $V_{th}$ is a negative value for P-type transistors, so the potentials at the control terminal N1 and the drain N2 of the driving transistor 2 may both be (Vlow−|$V_{th}$|) as represented by a dashed line and marked as L7 in FIG. 4, where |$V_{th}$| represents a positive value. The potential difference between the first terminal and the second terminal of the first capacitor C1 may be (VDATA−Vlow−$V_{th}$). The phase t1 may be referred to as the resetting phase. FIG. 4 illustrates the phase t1 described above. EL may represent an OLED.

Figure 5:
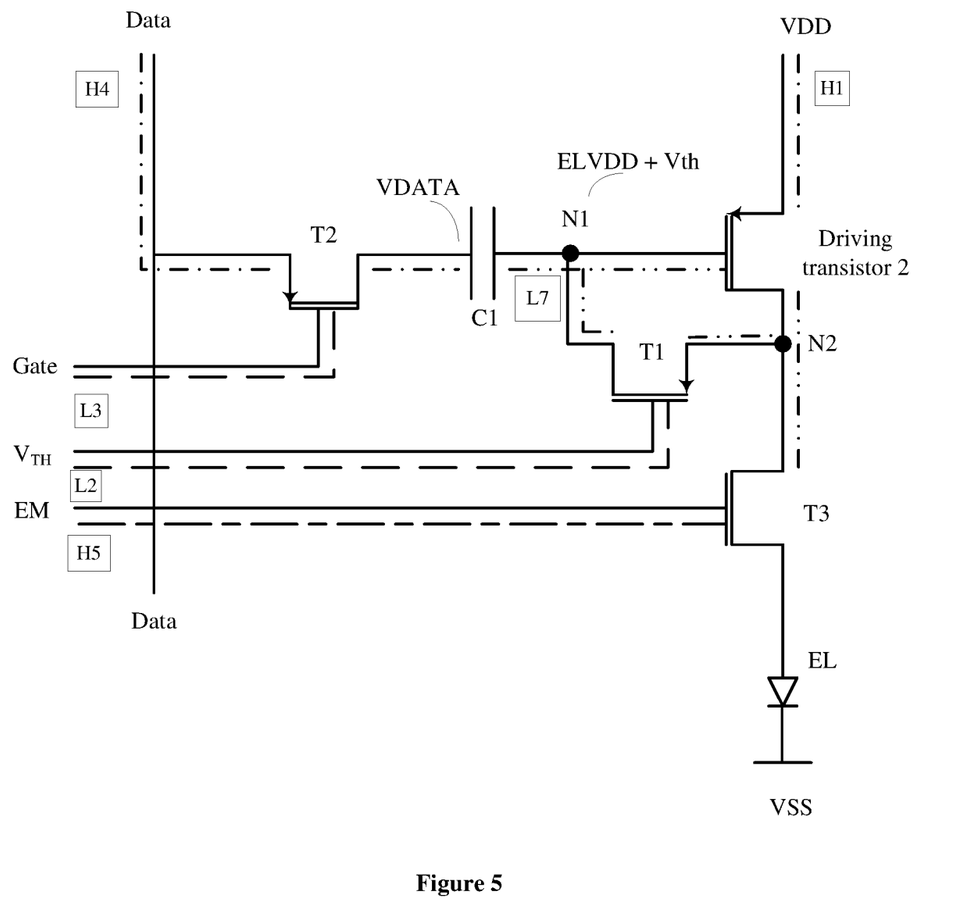

In phase t2, the voltage signal terminal VDD may output a high potential signal ELVDD (represented as a dash-dotted line and marked as H1 in FIG. 5), the threshold voltage signal terminal $V_{TH}$ may output a low potential signal (represented as a dashed line and marked as L2 in FIG. 5), and the gate line (Gate) may output a low potential signal (represented as a dashed line and marked as L3 in FIG. 5). The data line Data may output the first data signal VDATA (represented as a dash-dotted line and marked as H4 in FIG. 5), and the illuminating control terminal (EM) may output a high potential signal (represented as a short-dash-long-dashed line and marked as H5 in FIG. 5). The first transistor T1 and the second transistor T2 may be turned on, and the third transistor T3 may be turned off. The first transistor T1, in the "on" state, may provide the electrical connection between the control terminal N1 and the drain N2 of the driving transistor. The second transistor T2, in the "on" state, may provide the electrical connection between the data line Data and the first terminal of the first capacitor C1. The voltage signal terminal VDD may input the high potential signal ELVDD to the pixel circuit such that the control terminal N1 of the driving transistor 2 may be charged through the driving transistor 2 and the first transistor T1. When the potential of the control terminal N1 (i.e., gate) of the driving transistor 2 reaches (ELVDD+$V_{th}$), e.g., (ELVDD−|$V_{th}$|) and represented by a double-dotted line and marked as L7 in FIG. 5, the driving transistor 2 may be turned off and the charging process ends. The potential of the drain of the driving transistor 2 may also be (ELVDD+$V_{th}$). The potential difference between the two terminals of the first capacitor C1 may be (VDATA−ELVDD−$V_{th}$). The phase t2 may be referred to as the compensating phase. FIG. 5 illustrates the phase t2 described above.

Figure 6:
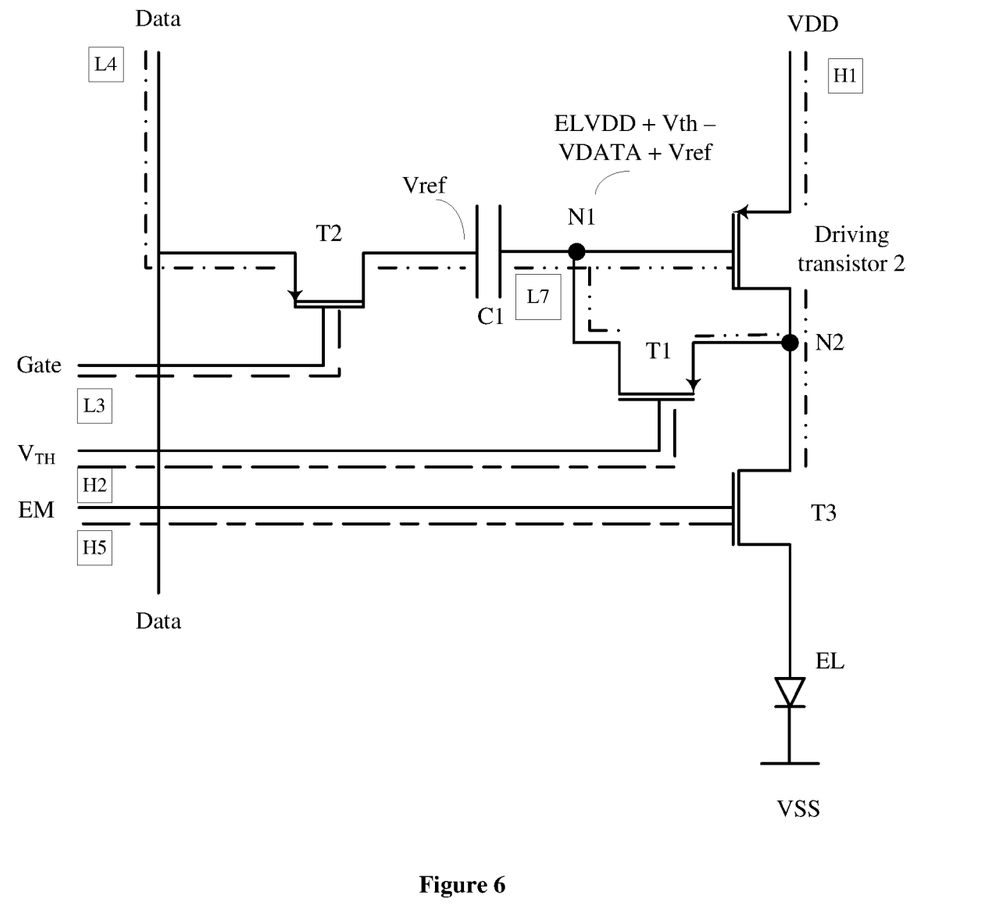

In phase t3, the voltage signal terminal VDD may output a high potential signal ELVDD (represented as a dash-dotted line and marked as H1 in FIG. 6), the threshold voltage signal terminal $V_{TH}$ may output a high potential signal (represented as a short-dash-long-dashed line and marked as H2 in FIG. 6), and the gate line (Gate) may output a low potential signal (represented as a dashed line and marked as L3 in FIG. 6). The data line (Data) may output the second data signal Vref (represented as a dash-dotted line and marked as L4 in FIG. 6), and the illuminating control terminal (EM) may output a high potential signal (represented as a short-dash-long-dashed line and marked as H5 in FIG. 6). The second transistor T2 may be turned on, and the first transistor T1 and the third transistor T3 may be turned off. The second transistor T2, in the "on" state, may provide the electrical connection between the data line Data and the first terminal of the first capacitor C1. The data line Data may input the second data signal Vref to the pixel circuit so that the potential of the first terminal of the first capacitor C1 may change from VDATA to Vref. The potential of the second terminal of the first capacitor (i.e., the terminal connected to the control terminal of the driving transistor 2) may change to (Vref−VDATA+ELVDD+$V_{th}$), i.e., (Vref−VDATA+ELVDD−|$V_{th}$|). Accordingly, the potential of the control terminal of the driving transistor 2 may change to (Vref-VDATA+ELVDD+$V_{th}$), i.e., the first preset potential, as represented by a double-dotted line and marked as L7 in FIG. 6. The potentials of the source and drain of the driving transistor 2 may maintain at ELVDD. The phase t3 may be referred to as the data writing phase. FIG. 6 illustrates the phase t3 described above.

Figure 7:
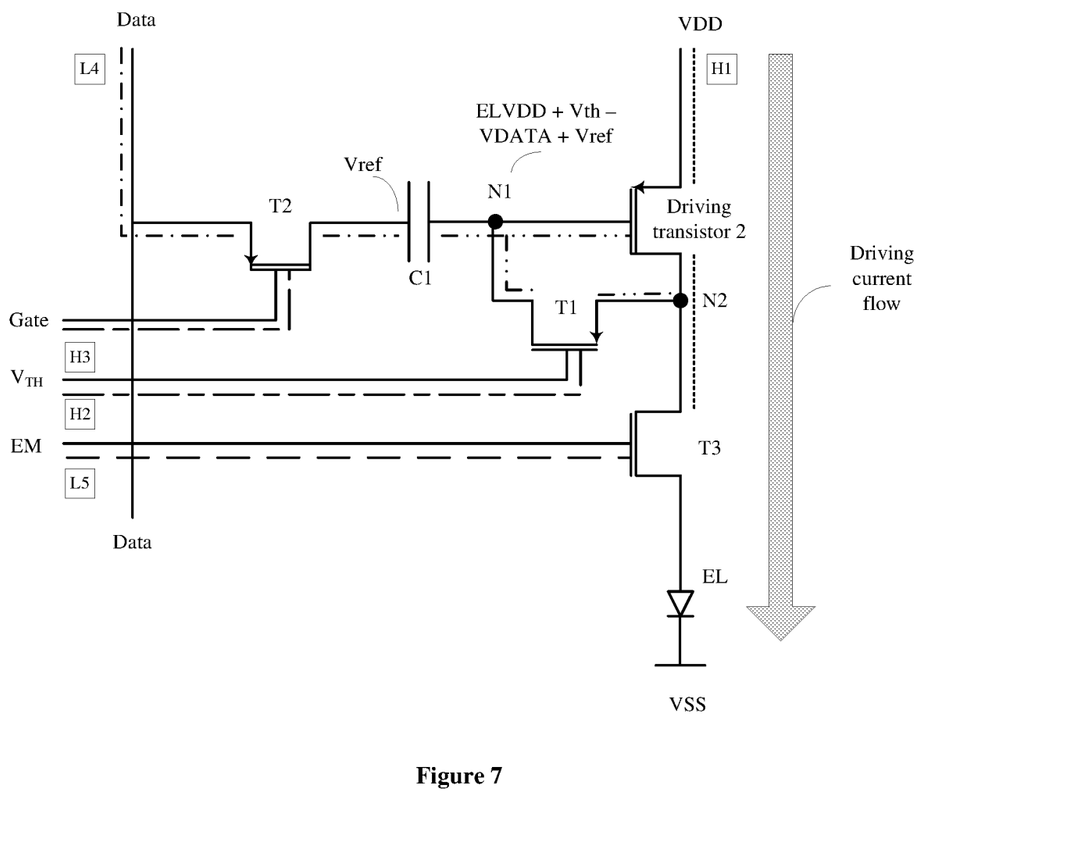

In phase t4, the voltage signal terminal VDD may input a high potential signal ELVDD (represented as a dotted line and marked as H1 in FIG. 7) to the pixel circuit, the threshold voltage signal terminal $V_{TH}$ may output a high potential signal (represented as a short-dash-long-dashed line and marked as H2 in FIG. 7), and the gate line (Gate) may output a high potential signal (represented as a short-dash-long-dashed line and marked as H3 in FIG. 7). The data line (Data) may output a low potential signal (represented as a dash-dotted line and marked as L4 in FIG. 7), and the illuminating control terminal (EM) may output a low potential signal (represented as a dashed line and marked as L5 in FIG. 7). The third transistor T3 may be turned on, and the first transistor T1 and the second transistor T2 may be turned off. The third transistor, in the "on" state, may provide the electrical connection between the second terminal of the driving transistor 2 and the input terminal of the illuminating device 05 such that the driving transistor 2 may drive the illuminating device 5 to emit light normally. The phase t4 may be referred as the illuminating phase. FIG. 7 illustrates the phase t4 described above.

In phase t4, the potential of the control terminal of the driving transistor 2 may be (Vref−VDATA+ELVDD+$V_{th}$), as represented by a double-dotted line and marked as H7 in FIG. 7, the potential of the first terminal (e.g., the source) of the driving transistor 2 may be ELVDD, and the driving current to drive the illuminating device 5 may be I=β/2($V_{gs}$−$V_{th}$)$^2$=β/2 (Vref−VDATA+ELVDD+$V_{th}$−ELVDD−$V_{th}$)$^2$. That is, the driving current is β/2 (Vref−VDATA)$^2$, where β is a constant associated with the manufacturing parameters and feature size of the driving transistor 2; and $V_{gs}$ is the potential difference between the control terminal and the source of the driving transistor 2. Thus, the "on" current of the illuminating device 5 may be independent of the voltage signal outputted by the voltage signal terminal VDD and the threshold voltage $V_{th}$ of the driving transistor 2. The effect on the brightness level of the illuminating device 5 caused by the attenuation of the voltage signal inputted into the driving transistor 2 and the variation of the threshold voltage $V_{th}$ of the driving transistor 2 can be eliminated.

Preferably, in one embodiment, the resetting control module 3 of each pixel may reset and compensate the corresponding driving transistor 2 when the display panel is turned on. The first data signal inputted into each pixel may have the same voltage value. By operating the pixel circuit as described above, no capacitor is required between the voltage signal terminal VDD and the resetting control module 3 of the driving transistor 2.

Figure 8:
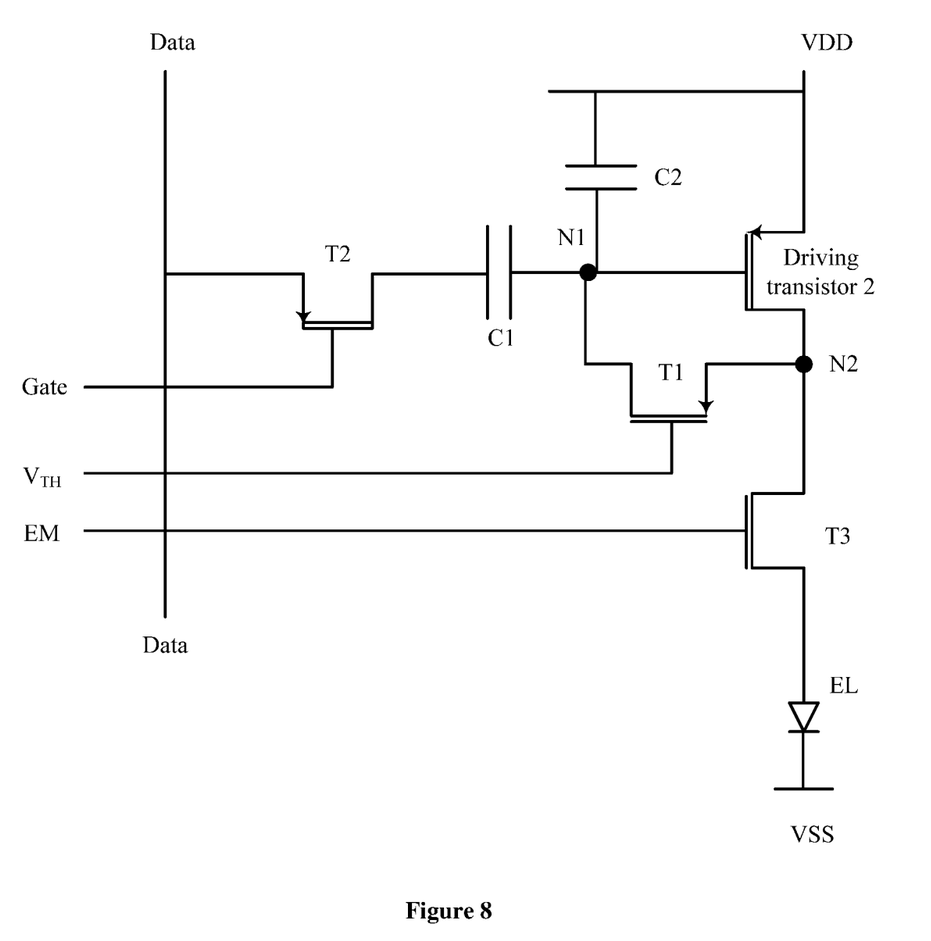
FIG. 8 illustrates another exemplary OLED pixel circuit provided by the present disclosure according to the embodiments.

In certain other embodiments, as shown in FIG. 8, a second capacitor C2 may be placed between the control terminal N1 of the driving transistor 2 and the voltage signal terminal VDD in order to prevent voltage floating at the control terminal N1. Through phases t1 to t4, the potential at the control terminal N1 may be the same as described above with the second capacitor C2. Details of the voltage change at each phase may be the same as the voltage changes illustrated in FIGS. 4 to 7, and are omitted herein.

In summary, the OLED pixel circuit provided by the present disclosure may reset and compensate the driving transistor 2 according to the data signal provided by the data line (Data) so that the control terminal of the driving transistor 2 may have the first preset potential. Based on the potential difference between the source of the driving transistor 2 and the first preset potential, the OLED pixel circuit may generate a driving current to drive the illuminating device 5 to emit light. The driving current generated as described above can be independent of the voltage signal inputted into the driving transistor 2 and the threshold voltage of the driving transistor 2. That is, the attenuation of the voltage signal VDD inputted into the driving transistor 2 and the variation of the threshold voltage of the driving transistor 2 may not affect the display brightness level of the OLED pixels and the quality of display of the display panel.

Another aspect of the present disclosure provides a method for driving the OLED pixel circuit described above. The method includes the following steps.

Step 1, in the first phase, the data line (Data) may input the first data signal into the resetting control module to reset and compensate the driving transistor.

Step 2, in the second phase, the data line (Data) may input the second data signal into the resetting control module such that the control terminal of the driving transistor may have the first preset potential. Based on the potential difference between the first preset potential and the potential of the source of the driving transistor, the driving transistor may generate a driving current for the illuminating device to emit light.

Step 3, in the third phase, the illuminating control terminal (EM) may send a control signal to the illuminating control module such that the illuminating control module may provide electrical connection between the driving transistor and the illuminating device. The driving current may flow from the driving transistor to the illuminating device.

Specifically, the method described above can be used to drive the OLED pixel circuit provided in the present disclosure. In the first phase, the charging control module may charge the first terminal of the first capacitor. The first terminal may refer to the terminal connected to the charging control module. The potential of the first terminal of the first capacitor may be the first data signal. The driving transistor may be turned on, and the threshold voltage signal terminal may input an "on" signal to the control terminal of the first transistor to turn on the first transistor. The first transistor, in the "on" state, may allow the voltage signal terminal VDD to charge the second terminal of the first transistor through the driving transistor and the first transistor.

In the second phase, the threshold voltage signal terminal may input an "off" signal into the control terminal of the first transistor to turn off the first transistor. The charging control module may charge the first terminal of the first capacitor, where the first terminal may refer to the terminal connected to the charging control module. The potential of the first terminal of the first capacitor may be the second data signal such that the second terminal of the first capacitor (i.e., the control terminal of the driving transistor) may have the first preset potential.

Specifically, from the first phase to the second phase (i.e., from phase t1 to phase t3), the gate line (Gate) may input "on" signals to the control terminal of the second transistor to maintain the second transistor to be in the "on" state. The data line (Data) may input the first data signal and the second data signal into the first terminal of the first capacitor, where the first terminal may refer to the terminal connected to the charging control module.

Further, in the first phase, the driving transistor may be turned on so that the voltage signal terminal may charge the second terminal of the first capacitor until the driving transistor is turned off, where the second terminal may refer to the terminal connected to the driving transistor. In the second phase, the driving transistor may be off. The potential of the control terminal of the driving transistor may be the first preset potential.

Further, in the first phase and the second phase, the illuminating signal terminal may input an "off" signal to the control terminal of the third transistor to turn off the third transistor such that the driving transistor and the illuminating device may be disconnected. In the third phase, the illuminating signal terminal may input an "on" signal to the control terminal of the third transistor to turn on the third transistor such that the driving transistor and the illuminating device may be connected.

In the disclosed method for driving the OLED pixel circuit, the data line (Data) may input the first data signal to the resetting control module in the first phase, and input the second data signal to the resetting control module in the second phase. The potential of the control terminal of the driving transistor may be the first preset potential. In addition, the driving transistor may generate a driving current to drive the illuminating device to emit light, where the driving current is generated based on the potential difference between the potential of the source of the driving transistor and the first preset potential. The driving current may be independent of the voltage signal inputted into the driving transistor and the threshold voltage of the driving transistor. That is, the display brightness level of the OLED pixels may not be affected by the attenuation of the voltage signal inputted into the driving transistor and the variation of the threshold voltage of the driving transistor. Thus, the quality of display of the display panel may be improved.

Another aspect of the present disclosure provides a display panel. The display panel includes the OLED pixel circuit provided in the present disclosure.

The display panel provided by the present disclosure may include the OLED pixel circuit disclosed such that the display brightness level of the pixels is not affected by the attenuation of the voltage signals inputted into the driving transistors and the variations of the threshold voltages. Thus, the quality of display of the display panel incorporating the disclosed OLED pixel circuit is not affected by the attenuation of the voltage signals inputted into the driving transistors and variations of the threshold voltages.

Another aspect of the present disclosure provides a display apparatus. The display apparatus includes the display panel provided in the present disclosure.

The display apparatus provided by the present disclosure may include the display panel disclosed such that the display brightness level of the pixels is not affected by the attenuation of the voltage signals inputted into the driving transistors and variations of the threshold voltages. Thus, the quality of display of the display apparatus, incorporated with the disclosed display panel, is not affected by the attenuation of the voltage signals inputted into the driving transistors and variations of the threshold voltages.

It should be understood that the above embodiments disclosed herein are exemplary only and not limiting the scope of this disclosure. Without departing from the spirit and scope of this invention, other modifications, equivalents, or improvements to the disclosed embodiments are understandable to those skilled in the art and are intended to be encompassed within the scope of the present disclosure.

The present disclosure may have many advantages. The OLED pixel circuit provided by the present disclosure may reset and compensate the driving transistor according to the data signal provided by the data line. The control terminal of the driving transistor may have the first preset potential. Based on the potential difference between the source of the driving transistor and the first preset potential, the OLED pixel circuit may generate a driving current to drive the illuminating device to emit light. The driving current may be independent of the voltage signal inputted into the driving transistor and the threshold voltage of the driving transistor. That is, the attenuation of the voltage signal and the variation of the threshold voltage may not affect the display brightness level of the OLED pixels and the quality of display of the display panel.

Further, in the method disclosed for driving the OLED pixel circuit, the data line may input the first data signal to the resetting control module in the first phase, and input the second data signal to the resetting control module in the second phase. The potential of the control terminal of the driving transistor may be the first preset potential. In addition, the driving transistor may generate a driving current to drive the illuminating device to emit light, where the driving current is generated based on the potential difference between the potential of the source of the driving transistor and the first preset potential. The driving current may be independent of the voltage signal inputted into the driving transistor and the threshold voltage of the driving transistor. That is, the display brightness level of the OLED pixels may not be affected by the attenuation of the voltage signal and the variation of the threshold voltage. Thus, the quality of display of the display panel may not be affected.

The display panel provided by the present disclosure may include the OLED pixel circuit disclosed such that the display brightness level of the pixels is not affected by the attenuation of the voltage signals inputted into the driving transistors and variations of the threshold voltages. Thus, the quality of display of the display panel, incorporated with the disclosed OLED pixel circuits, is not affected by the attenuation of the voltage signals inputted into the driving transistors and variations of the threshold voltages of the driving transistors.

The display apparatus provided by the present disclosure may include the display panel disclosed such that the display brightness level of the pixels is not affected by the attenuation of the voltage signals inputted into the driving transistors and variations of the threshold voltages. Thus, the quality of display of the display apparatus, incorporated with the disclosed display panel, is not affected by the attenuation of the voltage signals inputted into the driving transistors and variations of the threshold voltages of the driving transistors.

What is claimed is:

1. A method for driving an organic light emitting diode (OLED) pixel circuit comprising a charging control circuit, a resetting control circuit, a driving transistor, a data line, a gate line, an illuminating device, and an illuminating control circuit, wherein the resetting control circuit comprises a first transistor and a first capacitor, a control terminal of the first transistor is connected to a threshold voltage signal terminal, a first terminal of the first transistor is connected to a drain of the driving transistor and an input terminal of the illuminating control circuit, a second terminal of the first transistor is connected to a control terminal of the driving transistor, the first capacitor is placed between an output terminal of the charging control circuit and the control terminal of the driving transistor, a source of the driving transistor is connected to a voltage signal terminal, a drain of the driving transistor is connected to the first terminal of the first transistor and the input terminal of the illuminating control circuit, the charging control circuit is connected to a data signal line and the resetting control circuit, respectively, and the illuminating control circuit includes a third transistor, a control terminal of the third transistor is connected to an illuminating signal terminal, a first terminal of the third transistor is connected to the drain of the driving transistor, and a second terminal of the third transistor is connected to an input terminal of the illuminating device, the method including:
in a first phase, sending, by the data line, a first data signal to the resetting control circuit and sending, by the voltage signal terminal, a low potential signal and then a high potential signal to the driving transistor, to reset and compensate the driving transistor;
in a second phase, sending a second data signal by the data line to the resetting control circuit to set the control terminal of the driving transistor at a first preset potential, and generating a driving current by the driving transistor based on a potential difference between a potential of the source of the driving transistor and a potential of the control terminal of the driving transistor to drive the illuminating device to emit light; and
in a third phase, sending, by the illuminating signal terminal, a signal to the illuminating control circuit to provide electrical connection between the driving transistor and the illuminating device.

2. The method according to claim 1, further including:
in a phase t1 of the first phase, charging, by the charging control circuit, a first terminal of the first capacitor such that the first terminal receives a first data signal, the driving transistor is turned on and sending the low potential signal, by the voltage signal terminal, to the resetting control circuit to establish a potential diffidence between the first terminal and a second terminal of the first capacitor; and
in a phase t2 of the first phase, inputting, an "on" signal, by the threshold voltage signal terminal, to the control terminal of the first transistor to turn on the first transistor and sending the high potential signal, by the voltage signal terminal, to the resetting control circuit,
wherein the first terminal of the first capacitor is connected to the charging control circuit and the second terminal of the first capacitor is connected to the driving transistor.

3. The method according to claim 2, wherein in the phase t1:
the first transistor is turned on such that the voltage signal terminal is electrically connected to the driving transistor to reset potentials of the control terminal and the second terminal of the driving transistor.

4. The method according to claim 2, wherein the charging control circuit comprises a second transistor having a first terminal connected to the data line and a second terminal connected to the first terminal of the first capacitor, and in the second phase:
the second transistor is turned on such that the data line is connected to the first terminal of the first capacitor and the control terminal of the driving transistor is at the first preset potential.

5. The method according to claim 4, wherein a control terminal of the second transistor is connected to the gate line for providing scanning signals, a first terminal of the second transistor is connected to the data line, and a second terminal of the second transistor is connected to a first terminal of the first capacitor.

6. The method according to claim 4, wherein the first transistor, the second transistor, the third transistor, and the driving transistor are P-type transistors.

7. The method according to claim 2, wherein in the third phase:
the illuminating signal terminal inputs an "on" signal to the control terminal of the third transistor to turn on the third transistor such that the driving transistor is electrically connected to the illuminating device.

8. The method according to claim 2, wherein the third transistor is turned off in the first phase and the second phase.

9. The method according to claim 1, wherein the resetting control circuit is connected to the driving transistor to reset and compensate the driving transistor to set the control terminal of the driving transistor at a first potential value, and the driving transistor is configured to generate the driving current being based on a difference between a potential of the source of the driving transistor and the first potential value, irrespective of a voltage signal at the source of the driving transistor and a threshold voltage of the driving transistor.

10. The method according to claim 1, wherein the charging control circuit is configured to receive a data signal from the data signal line and to provide the data signal to the resetting control circuit.

11. The method according to claim 1, wherein the illuminating control circuit is between the driving transistor and the illuminating device to control a connection between the driving transistor and the illuminating device.

12. The method according to claim 1, wherein, under the control of a threshold voltage signal, a voltage signal provided by the voltage signal terminal flows from the driving transistor into the resetting control circuit, resetting and compensating the driving transistor to set the control terminal of the driving transistor at a first preset potential.

13. The method according to claim 1, wherein the resetting control circuit includes a second capacitor, a first terminal of the second capacitor is connected to a terminal of the first capacitor and the control terminal of the driving transistor, and a second terminal of the second capacitor is connected to the voltage signal terminal.

14. The method according to claim 1, wherein, under the control of a gate signal provided by the gate line, the charging control circuit provides a data signal to the resetting control circuit.

15. The method according to claim 1, wherein, under the control of an illuminating signal provided by the illuminating signal terminal, a driving current flows from the driving transistor into the illuminating device.

* * * * *